(12) United States Patent
Ho et al.

(10) Patent No.: US 7,666,764 B2
(45) Date of Patent: Feb. 23, 2010

(54) COMPOUND SEMICONDUCTOR MATERIAL AND METHOD FOR FORMING AN ACTIVE LAYER OF A THIN FILM TRANSISTOR DEVICE

(75) Inventors: Jia-Chong Ho, Taipei Hsien (TW); Jen-Hao Lee, Taichung (TW); Cheng-Chung Lee, Taitung (TW); Yu-Wu Wang, Hsinchu Hsien (TW); Chun-Tao Lee, Hsinchu (TW); Pzng Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 478 days.

(21) Appl. No.: 11/489,469

(22) Filed: Jul. 20, 2006

(65) Prior Publication Data
US 2006/0270197 A1   Nov. 30, 2006

Related U.S. Application Data

(62) Division of application No. 10/730,073, filed on Dec. 9, 2003, now abandoned.

(30) Foreign Application Priority Data
Sep. 18, 2003   (TW) ............................. 92125815 A

(51) Int. Cl.
  *H01L 21/208* (2006.01)
  *H01L 21/84* (2006.01)

(52) U.S. Cl. .................... 438/483; 438/499; 438/502; 438/151; 438/158; 438/159; 257/E29.094; 257/E29.098; 257/E29.296; 257/E21.411; 257/E21.7

(58) Field of Classification Search ................. 438/483, 438/486, 500, 502, 151, 158, 159, 499; 257/E29.094, 257/E29.098, E29.296, E21.7, E21.411
See application file for complete search history.

(56) References Cited

U.S. PATENT DOCUMENTS

| 4,321,163 | A |   | 3/1982 | Wahl et al. ............... 252/513 |
| 5,699,035 | A | * | 12/1997 | Ito et al. ................... 338/21 |
| 6,028,020 | A |   | 2/2000 | Tanaka et al. .............. 501/7 |
| 6,597,109 | B1 |  | 7/2003 | Arai et al. ................. 313/506 |
| 2003/0219920 | A1 |  | 11/2003 | Baek et al. ................ 438/30 |
| 2004/0222412 | A1 |  | 11/2004 | Bai et al. .................. 257/40 |
| 2005/0127380 | A1 |  | 6/2005 | Kawasaki et al. ........... 257/84 |
| 2008/0164466 | A1 | * | 7/2008 | Rioux et al. ............... 257/43 |
| 2008/0296567 | A1 | * | 12/2008 | Irving et al. .............. 257/43 |
| 2008/0299771 | A1 | * | 12/2008 | Irving et al. .............. 438/681 |
| 2008/0303037 | A1 | * | 12/2008 | Irving et al. .............. 257/88 |

* cited by examiner

Primary Examiner—M. Wilczewski
(74) Attorney, Agent, or Firm—Bacon & Thomas, PLLC

(57) ABSTRACT

A compound semiconductor material for forming an active layer of a thin film transistor device is disclosed, which has a group II-VI compound doped with a dopant ranging from 0.1 to 30 mol %, wherein the dopant is selected from a group consisting of alkaline-earth metals, group IIIA elements, group IVA elements, group VA elements, group VIA elements, and transitional metals. The method for forming an active layer of a thin film transistor device by using the compound semiconductor material of the present invention is disclosed therewith.

10 Claims, 5 Drawing Sheets

US 7,666,764 B2

COMPOUND SEMICONDUCTOR MATERIAL AND METHOD FOR FORMING AN ACTIVE LAYER OF A THIN FILM TRANSISTOR DEVICE

This application is a divisional application of pending U.S. application Ser. No. 10/730,073, filed Dec. 9, 2003 (of which the entire disclosure of the pending, prior application is hereby incorporated by reference).

BACKGROUND OF THE INVENTION

1. Field of the Invention

The present invention relates to a compound semiconductor material and, more particularly, to a compound semiconductor material suitable for forming the active layer of a thin film transistor of an active matrix flat panel display.

2. Description of Related Art

Recently, the active matrix flat panel display has become a popular focus for research and development. In particular, the emphasis of that research and development is directed to the thin film transistor. In addition to that, the flat panel display has been developed to have a large active area, a low price, and a high resolution. Currently, the thin film transistors (TFTs) are classified as the amorphous silicon TFTs and the low temperature polycrystalline silicon TFTs, both of which need to undergo the vacuum evaporation process and the photolithography process, and thus have a high manufacturing cost. Lately, a method for manufacturing a thin film transistor using a group II-VI compound semiconductor by a solution process is disclosed. This method requires simple equipment, and has low cost and a fast processing speed.

However, take the manufacturing of ZnO transistors by the Sol-gel process for example. Although the Sol-gel process is simple and the materials used therein have a low toxicity, the characteristics of the transistors produced are not satisfactory. For instance, the current on/off ratio obtained is $10^3$, as shown in FIG. 1. Besides, there is research to manufacture a group II-VI compound, such as CdSe or CdS, transistors by a Chemical Bath Deposition (CBD) process. As shown in FIG. 2, the mobility of CdSe transistors reaches 15 $cm^2$/Vs, the current on/off ratio obtained is $10^7$, and the critical voltage is 3.5 V. Similarly, the mobility of CdS transistors reaches 1 $cm^2$/Vs, the current on/off ratio obtained is $10^6$, and the critical voltage is 2.6 V, as shown in FIG. 3. Although they both have good electrical characteristics, the precursors of CdSe and CdS are heavy metals that are quite toxic. Therefore, it is not feasible to mass-produce those transistors due to the problems of safety and environmental protection.

In the prior arts, the doped ZnO materials are mainly applied to the manufacturing of fluorescent films, and have not been used in the active layer of transistors yet. Therefore, it is desirable to provide a compound semiconductor material and a method for forming an active layer of a thin film transistor device to mitigate and/or obviate the aforementioned problems.

SUMMARY OF THE INVENTION

The object of the present invention is to provide a compound semiconductor material for forming an active layer of a thin film transistor device so that the transistors of an active matrix flat panel display are high voltage-durable and have improved device characteristics. Furthermore, the present invention uses the solution process to form the active layer but does not use vacuum evaporation, so it is easy to obtain a large area dispersion, to reduce the cost, and to preclude the toxic substances.

Another object of the present invention is to provide a method for forming an active layer of a thin film transistor device so that a large display area of the active matrix flat panel display is easily obtained, the manufacturing cost is reduced, no toxic substance is produced, and the manufacturing of the thin film transistor device benefits.

To achieve the object, the compound semiconductor material for forming an active layer of a thin film transistor device of the present invention includes a group II-VI compound doped with a dopant ranging from 0.1 to 30 mol %, wherein the dopant is selected from a group consisting of alkaline-earth metals, group IIIA elements, group IVA elements, group VA elements, group VIA elements, and transitional metals.

To achieve the object, the method for forming an active layer of a thin film transistor device of the present invention includes the steps of (a) providing a precursor solution of a compound semiconductor material; (b) patterning the precursor solution on a thin film transistor device to form an active layer; and (c) heating the precursor solution of the active layer on the thin film transistor device to evaporate the solvent in the precursor solution and to form a group II-VI compound layer doped with a dopant ranging from 0.1 to 30 mol %; wherein the dopant is selected from a group consisting of alkaline-earth metals, group IIIA elements, group IVA elements, group VA elements, group VIA elements, and transitional metals.

In the present invention, the precursor of the compound semiconductor materials, which are subsequently applied to form the active layer of a thin film transistor device, is prepared by a solution process. The compound semiconductor materials of the present invention have a group II-VI compound doped with an alkaline-earth metal, a group IIIA element, a group IVA element, a group VA element, a group VIA element, or a transitional metal, wherein the group II-VI compound is ZnO, ZnS, ZnSe, CdSe, CdS, HgS, MnS, SnS, PbS, CoS, NiS, or CdTe; the alkaline-earth metal is Mg, Ca, Sr, or Ba; the transitional metal is Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, or Au; the group IIIA element is B, Al, Ga, In, or Tl; the group IVA element is Si, Ge, Sn, or Pb; the group VA element is N, P, As, Sb, or Bi; and the group VIA element is S, Se, Te, or Po.

The solution process for preparing the precursor of the compound semiconductor materials of the present invention can be Chemical Bath Deposition, Photochemical Deposition, or Sol-gel process. Next, the active layer of the thin film transistor is patterned through Inkjet Printing, Nanoimprinting, Micro Contact Printing, or a spin coating-photolithography process. The structure of the thin film transistor can be any conventional structure. Preferably, the structure is a bottom gate structure, top gate structure, or side gate structure. The thin film transistor includes a gate electrode, a source electrode, a drain electrode, a dielectric layer, and a substrate. Preferably, the gate electrode, the source electrode, or the drain electrode of the thin film transistor device is made of metals, electrically conductive oxides, or electrically conductive polymers. Preferably, the dielectric constant of the dielectric layer is more than 3. More preferably, the dielectric layer is made of inorganic materials, polymers, or the material having a high dielectric constant. Preferably, the substrate is a silicon wafer, a glass substrate, a quartz substrate, a plastic substrate, or a flexible substrate.

The present invention provides a new compound semiconductor material, which forms the active layer of a thin film transistor by using the solution process. The thin film transistor is thus durable for high voltage operation and has optimum characteristics. Moreover, the compound semiconductor materials of the present invention are suitable for manufacturing the large size active matrix flat panel display because no vacuum evaporation is needed and the manufacturing cost is therefore reduced relative to prior art. In addition to that, the precursor formed in the solution process is not toxic, so there is no concern about the safety and protection of the operational environment.

Other objects, advantages, and novel features of the invention will become more apparent from the following detailed description when taken in conjunction with the accompanying drawings.

DETAILED DESCRIPTION OF THE PREFERRED EMBODIMENT

Embodiment 1

In the solution process, all of the oxides of group II-VI compounds can use 2-methoxy-ethanol or other alcohols as the solvent. When choosing the solvent, the factors concerned are the solubility of a solute, the ability for film formation of the solution, the removing of the solvent, and the growth of the grain.

Figure 1:
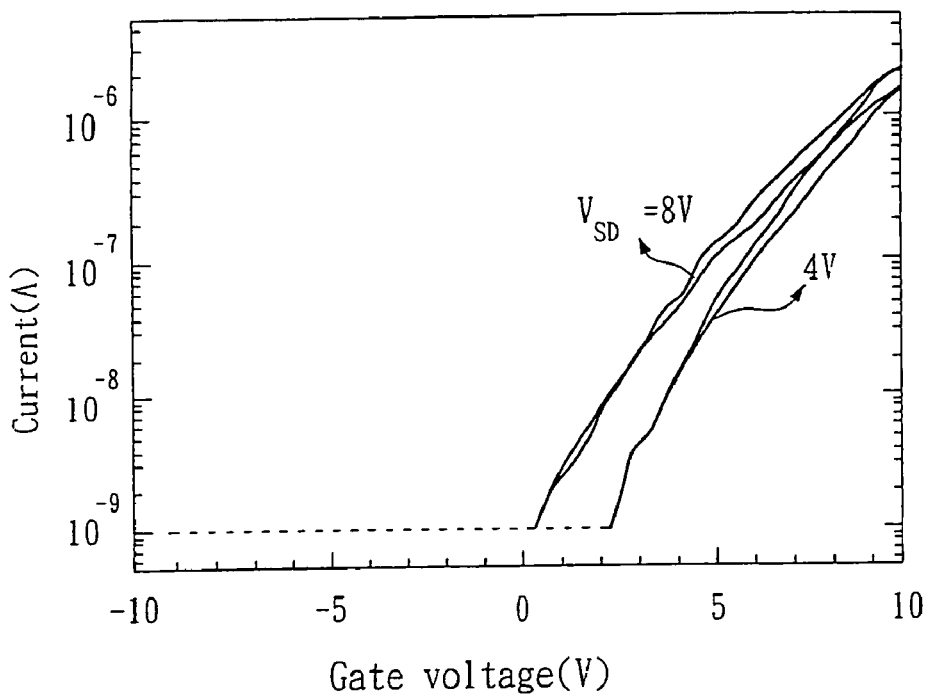
FIG. 1 shows the relation curve of gate voltage and drain current of a ZnO transistor in prior arts.
Figure 2:
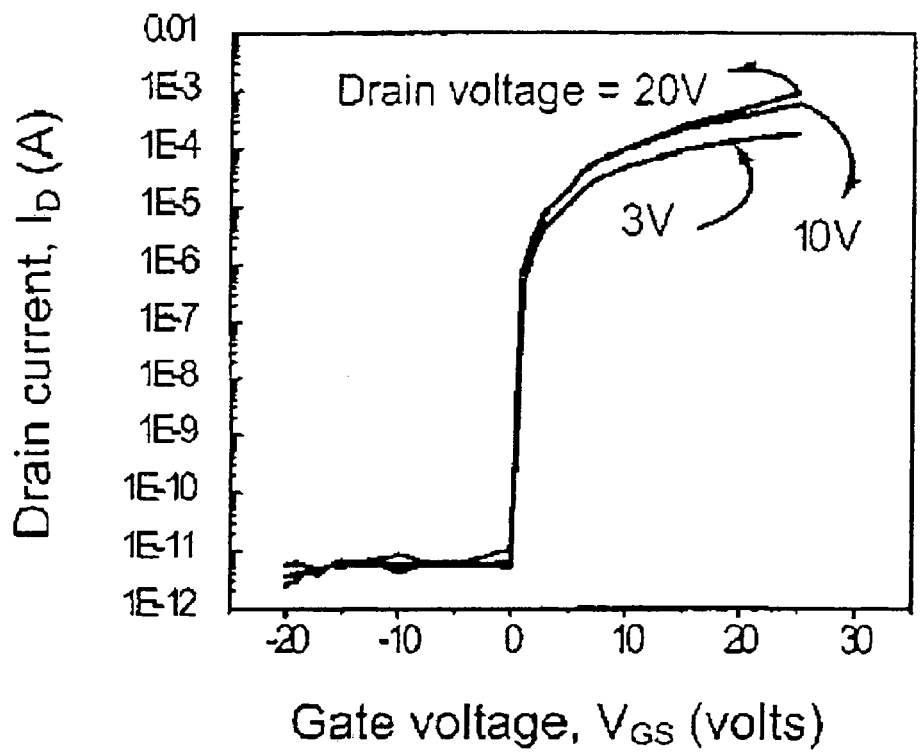
FIG. 2 shows the relation curve of gate voltage and drain current of a CdSe transistor in prior arts.
Figure 3:
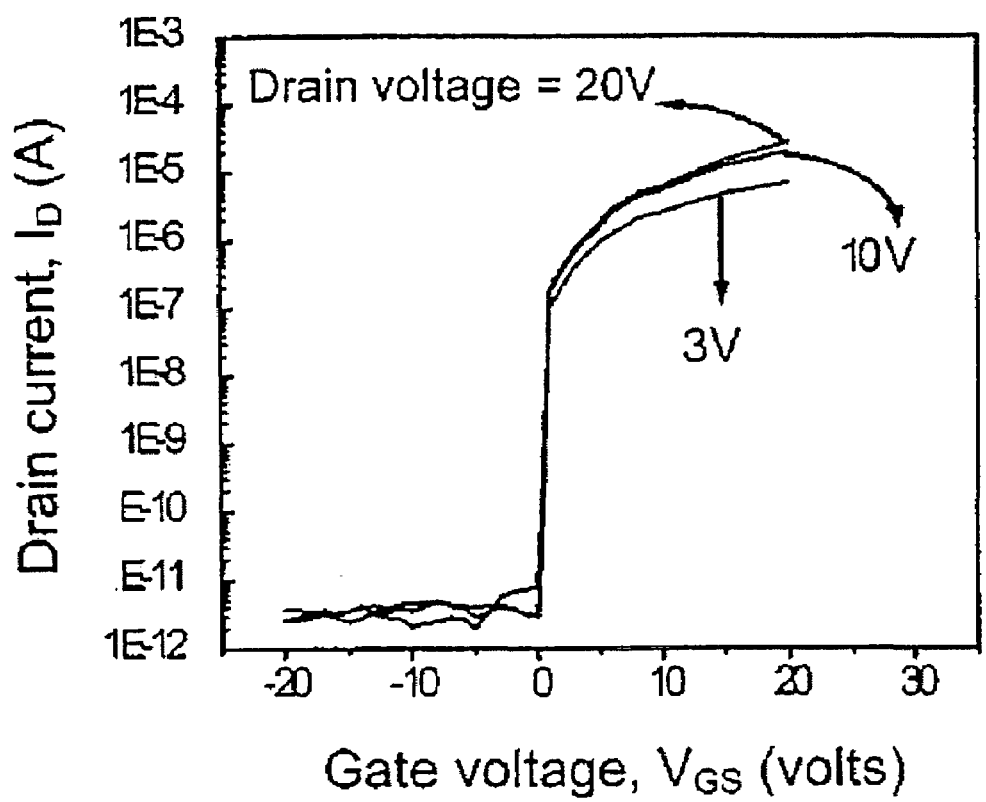
FIG. 3 shows the relation curve of gate voltage and drain current of a CdS transistor in prior arts.
Figure 4:
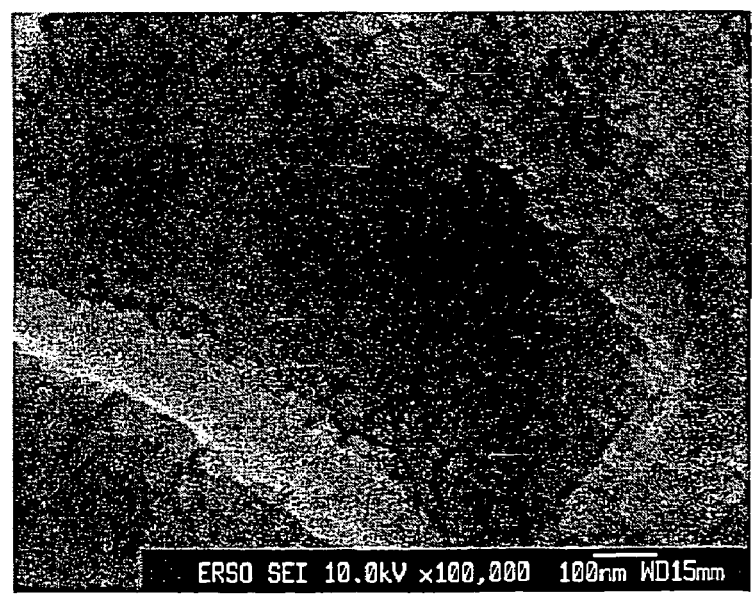
FIG. 4 is the SEM picture of the Mg-doped ZnO compound semiconductor material of one preferred embodiment of the present invention.

In the present embodiment, ZnO is doped with Mg to form a compound semiconductor material. First, 100 ml of solvent, i.e. 2-Methoxy-ethanol is mixed with 4.58 g of monoethanol amine. Then, 0.06 mole of zinc acetate and 0.015 mole of $MgCl_2$ are further added into the solvent and stirred at 60 degrees C. for 30 minutes to prepare a precursor solution of Zn(0.8)Mg(0.2)O. Afterwards, the precursor solution is coated at the channels of the transistors by Inkjet Printing. Finally, the precursor solution coated at the channels of the transistors is annealed at 500 degrees C. for 2 hours in an oven. With reference to FIG. 4, the SEM picture shows that the grain size of the Mg-doped ZnO is about 20 nm.

Embodiment 2

Figure 5A:
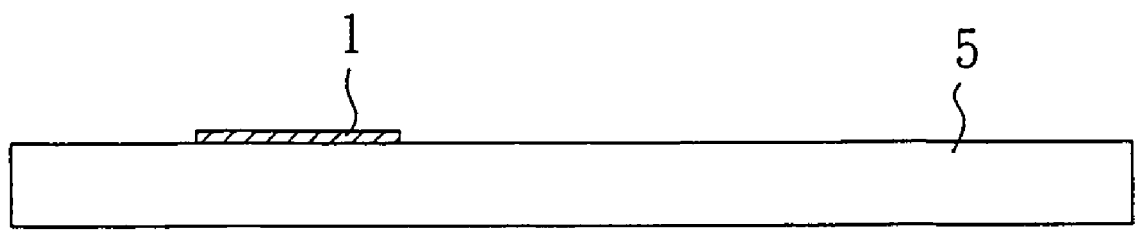
FIGS. 5A-5D show the process flow for manufacturing a thin film transistor of one preferred embodiment of the present invention.
Figure 5B:
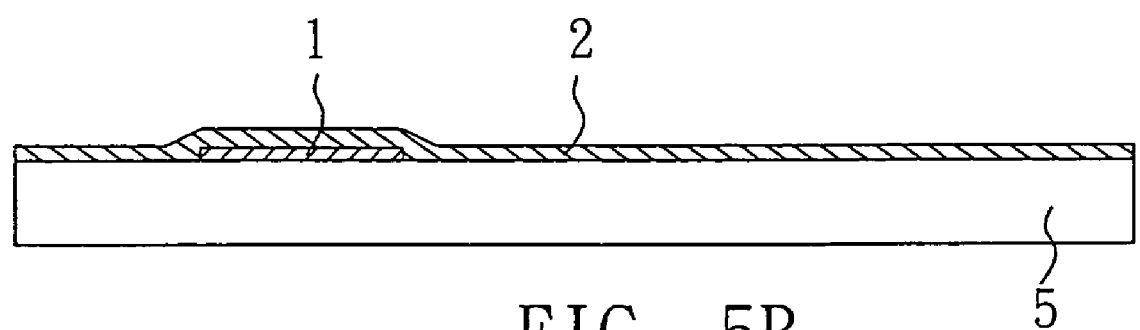
Figure 5C:
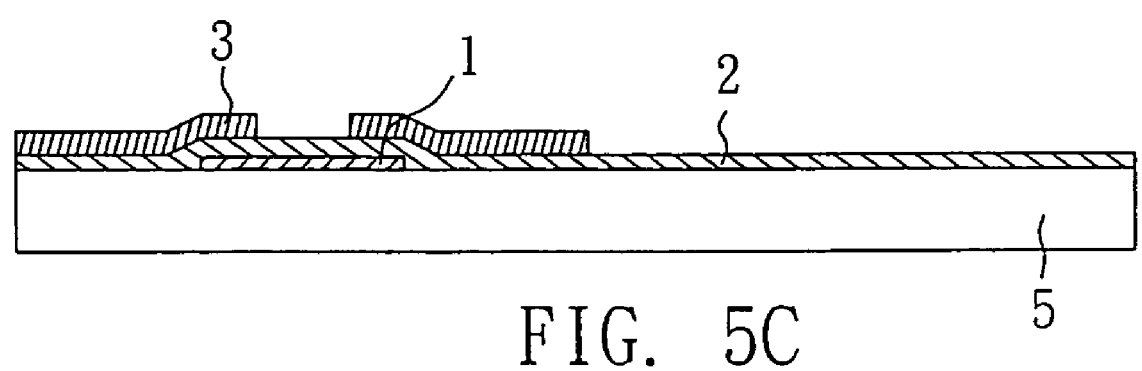
Figure 5D:
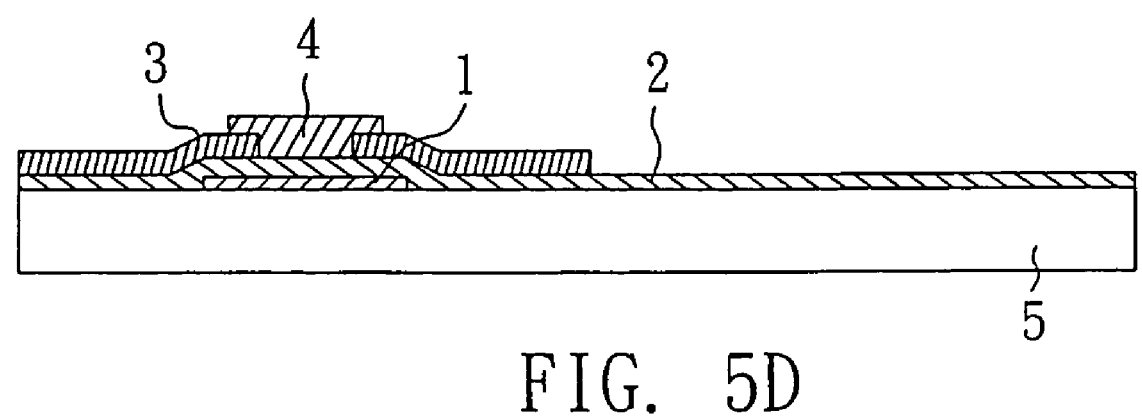

With reference to FIGS. 5A~5D, the process flow for manufacturing a thin film transistor is shown, wherein the bottom gate of the thin film transistor is formed with the compound semiconductor material of the present invention. As shown in FIG. 5A, a glass substrate 5 is provided, and then a first electrode layer is formed thereon. The first electrode layer is made of electrically conductive material, such as ITO, Cr, Al, Mo, Au, Pt, Ag, etc. Next, the first electrode layer is patterned by photolithography and etching processes and a gate electrode 1 is formed. As shown in FIG. 5B, an insulating layer 2 is subsequently deposited on the gate electrode 1. The insulating layer 2 can be made of silicon oxides, silicon nitrides, or PZT. The insulating layer 2 can be deposited by any conventional method. Preferably, the insulating layer 2 is deposited by physical vapor deposition or chemical vapor deposition. As shown in FIG. 5C, a second electrode layer 3 is formed by sputtering. The second electrode layer can be made of ITO, Cr, Al, Mo, Au, Pt, or Ag. Afterwards, the second electrode layer is patterned to form the source electrode and drain electrode 3. As shown in FIG. 5D, the precursor solution prepared by a solution process, such as Chemical Bath Deposition, Photochemical Deposition, or Sol-gel process, of the present invention is used to form the active layer 4. The active layer 4 can be formed and patterned by Inkjet Printing, Nanoimprinting, Micro Contact Printing, or a spin coating-photolithography process. After being heated, the active layer 4 having a group II-VI compound doped with an alkaline-earth metal, a group IIIA element, a group IVA element, a group VA element, a group VIA element, or a transitional metal is obtained.

Figure 6A:
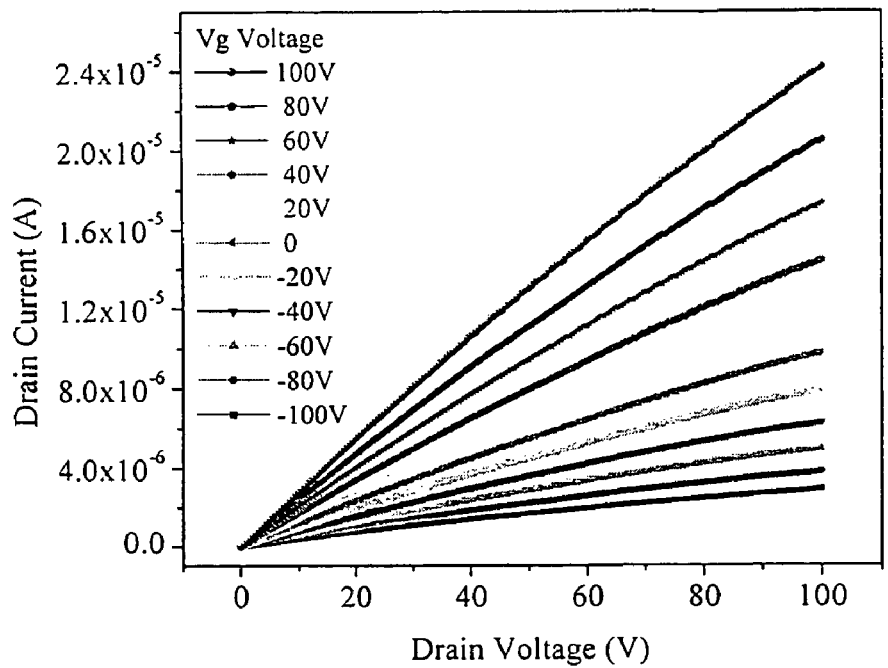
FIG. 6A shows the relationship between the drain voltage (Vd) and the drain current (Id) of a ZnO transistor in the prior arts.
Figure 6B:
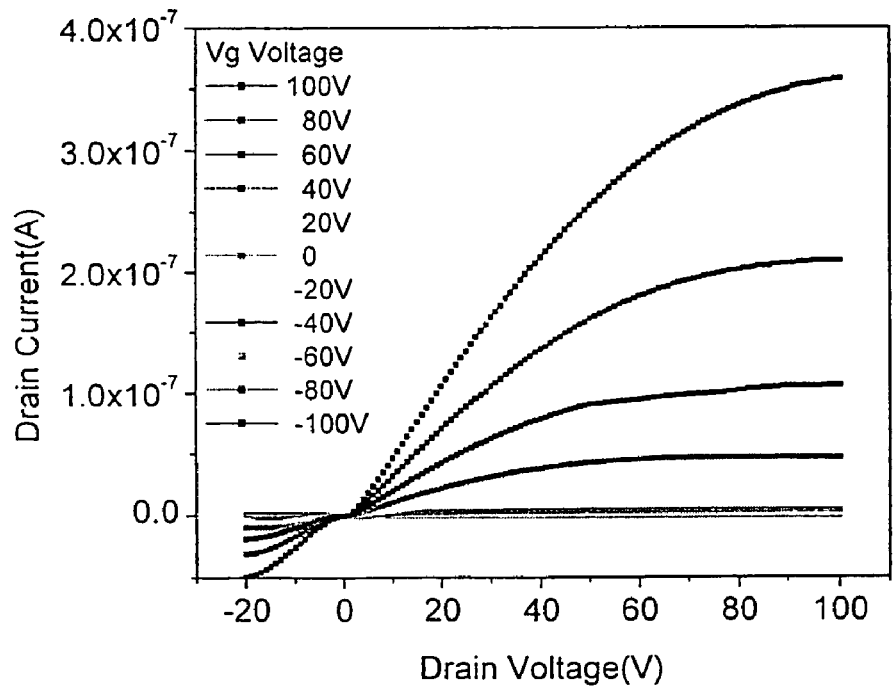
FIG. 6B shows the relationship between the drain voltage (Vd) and the drain current (Id) of a Zn(0.8)Mg(0.2)O transistor of one preferred embodiment of the present invention.

FIGS. 6A and 6B show the relationship between the drain voltage (Vd) and the drain current (Id) of the transistors having ZnO and Zn(0.8)Mg(0.2)O active layer, respectively. When ZnO is not doped, the characteristic curve of Id to Vd is nearly linear, which reveals that the characteristics of ZnO are similar to that of a resistor. Furthermore, the leakage current Id is around $10^{-6}$ A when the voltage of gate electrode is $-100$ V and the voltage of drain electrode is 100 V. On the other hand, when ZnO is doped with 20% of the alkaline-earth metal, i.e. Mg, the characteristic curve of Id vs. Vd tends to be similar with that of semiconductors. In particular, the leakage current Id is around $10^{-11}$ A when the voltage of gate electrode is $-100$ V and the voltage of drain electrode is 100 V. Besides, the current on/off ratio of the transistor is $10^4$, and its mobility is $5\times10^{-4}$ cm$^2$/Vs. From the experimental results, it is obvious that the Mg-doped ZnO reduces the off current from 4 µA to 20 pA.

Figure 7:
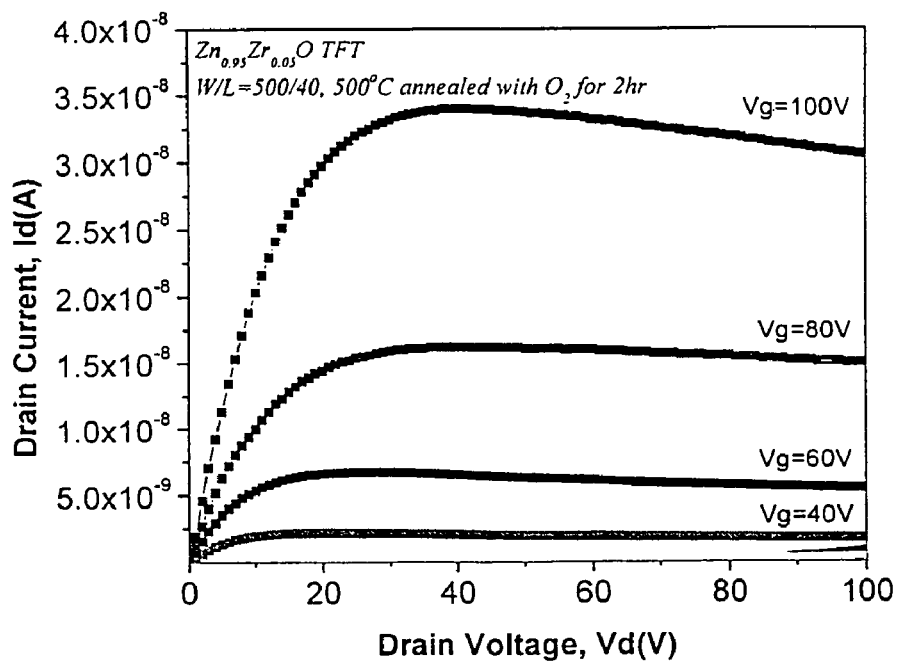
FIG. 7 shows the relationship between the drain voltage (Vd) and the drain current (Id) of a Zr-doped ZnO transistor of another preferred embodiment of the present invention.
Figure 8:
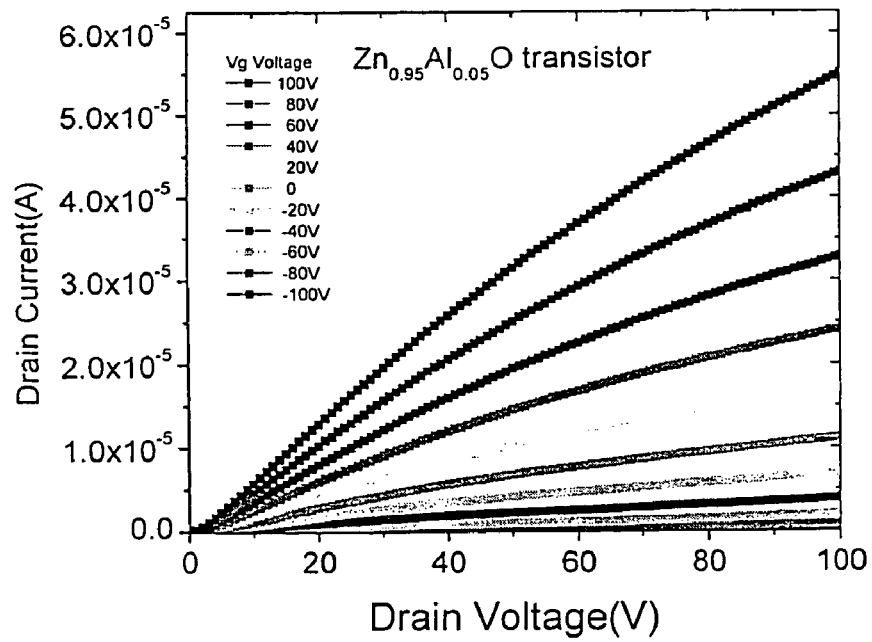
FIG. 8 shows the relationship between the drain voltage (Vd) and the drain current (Id) of an Al-doped ZnO transistor of the other preferred embodiment of the present invention.

In addition to Mg, Al and Zr also can improve the characteristics of the transistor. When ZnO is doped with Zr, the off current drops to 1 pA, as shown in FIG. 7. Similarly, when ZnO is doped with Al, the on current increases from 25 µA to 60 µA, as shown in FIG. 8.

Although the present invention has been explained in relation to its preferred embodiment, it is to be understood that many other possible modifications and variations can be made without departing from the spirit and scope of the invention as hereinafter claimed.

What is claimed is:

1. A method for forming an active layer of a thin film transistor device, comprising following steps:
    (a) providing a precursor solution of a compound semiconductor material, wherein the precursor solution comprising at least one alcohol and a dopant;
    (b) patterning the precursor solution on a thin film transistor device to form an active layer; and
    (c) heating the precursor solution of the active layer on the thin film transistor device to evaporate the solvent in the precursor solution and to form a group II-VI compound layer doped with a dopant ranging from 0.1 to 30 mol %;
    wherein the dopant is Mg, Zr, or Al.

2. The method as claimed in claim 1, wherein the group II-VI compound is ZnO, ZnS, ZnSe, CdSe, CdS, HgS, MnS, SnS, PbS, CoS, NiS, or CdTe.

3. The method as claimed in claim 1, wherein the precursor solution of the compound semiconductor material is formulated by Chemical Bath Deposition, Photochemical Deposition, or Sol-gel process in step (a).

4. The method as claimed in claim 1, therein the patterning of the active layer on the thin film transistor device is carried out by Inkjet Printing, Nanoimprinting, Micro Contact Printing, or a spin coating-photolithography process.

5. The method for forming an active layer of a thin film transistor device of claim 1, comprising following steps:
   (a) providing a precursor solution of a compound semiconductor material, wherein the precursor solution comprising at least one alcohol having 1 to 6 carbon atoms, at least one organic acid salt having 1 to 6 carbon atoms and a dopant;
   (b) patterning the precursor solution on a thin film transistor device to form an active layer; and
   (c) heating the precursor solution of the active layer on the thin film transistor device to evaporate the solvent in the precursor solution and to form a group II-VI compound layer doped with a dopant ranging from 0.1 to 30 mol %;
   wherein the metal of the organic acid salt is a group II-VI element, the dopant is Mg, Zr, or Al.

6. The method as claimed in claim 1, wherein the active layer is formed from zinc oxide doped with an effective amount of dopant which is Mg, or Al.

7. The method as claimed in claim 6, wherein the precursor solution contains as solvent 2-methoxy ethanol mixed with monoethanol amine, zinc acetate and magnesium chloride.

8. The method as claimed in claim 7, wherein the precursor solution contains Zn(0.8)Mg(0.2)O and wherein the Mg-doped active layer of ZnO has a grain size of about 20 nm.

9. The method as claimed in claim 6, wherein in the dopant is uniformly distributed throughout the solution and resulting active layer.

10. The method as claimed in claim 6 wherein the dopant is Mg and off current of the transistor containing the active layer is 1 pA.

* * * * *

UNITED STATES PATENT AND TRADEMARK OFFICE
CERTIFICATE OF CORRECTION

PATENT NO. : 7,666,764 B2 Page 1 of 1
APPLICATION NO. : 11/489469
DATED : February 23, 2010
INVENTOR(S) : Ho et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 696 days.

Signed and Sealed this

Fourth Day of January, 2011

David J. Kappos
*Director of the United States Patent and Trademark Office*